United States Patent
Tokashiki et al.

(10) Patent No.: US 8,460,508 B2
(45) Date of Patent: Jun. 11, 2013

(54) SYNCHRONOUS PULSE PLASMA ETCHING EQUIPMENT AND METHOD OF FABRICATING A SEMICONDUCTOR DEVICE

(75) Inventors: Ken Tokashiki, Seongnam-si (KR); Hong Cho, Yongin-si (KR); Jeong-Dong Choe, Anyang-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 795 days.

(21) Appl. No.: 12/591,602

(22) Filed: Nov. 24, 2009

(65) Prior Publication Data

US 2010/0130018 A1    May 27, 2010

(30) Foreign Application Priority Data

Nov. 24, 2008    (KR) .................. 10-2008-0117111

(51) Int. Cl.
*H01L 21/3065* (2006.01)
*H01L 21/302* (2006.01)
*C23C 16/00* (2006.01)
*C23C 16/50* (2006.01)
*C23C 16/52* (2006.01)

(52) U.S. Cl.
USPC ............ 156/345.28; 156/345.24; 156/345.43; 156/345.44; 156/345.47; 156/345.48; 118/723 R; 118/723 E; 118/723 ER; 118/723 I; 118/723 IR; 315/111.21; 438/710; 438/714; 216/67; 216/68; 216/71

(58) Field of Classification Search
USPC ............ 156/345.43, 345.44, 345.47, 345.48, 156/345.24, 345.28; 118/723 R, 723 ER, 118/723 E, 723 I, 723 IR; 315/111.21; 438/710, 438/714; 216/67, 68, 71
See application file for complete search history.

(56) References Cited

U.S. PATENT DOCUMENTS

| | | | | |
|---|---|---|---|---|
| 5,573,595 | A * | 11/1996 | Dible | 118/723 MP |
| 5,928,528 | A | 7/1999 | Kubota et al. | |
| 7,988,874 | B2 * | 8/2011 | Lee et al. | 216/67 |
| 2001/0051438 | A1 * | 12/2001 | Shin et al. | 438/706 |
| 2003/0151372 | A1 * | 8/2003 | Tsuchiya et al. | 315/111.81 |
| 2004/0107906 | A1 * | 6/2004 | Collins et al. | 118/723 I |

(Continued)

FOREIGN PATENT DOCUMENTS

| | | |
|---|---|---|
| JP | 10-079372 | 3/1998 |
| JP | 2001-244250 | 9/2001 |

(Continued)

*Primary Examiner* — Jeffrie R Lund
(74) *Attorney, Agent, or Firm* — Harness, Dickey & Pierce, P.L.C.

(57) ABSTRACT

Synchronous pulse plasma etching equipment includes a first electrode and one or more second electrodes configured to generate plasma in a plasma etching chamber. A first radio frequency power output unit is configured to apply a first radio frequency power having a first frequency and a first duty ratio to the first electrode, and to output a control signal including information about a phase of the first radio frequency power. At least one second radio frequency power output unit is configured to apply a second radio frequency power having a second frequency and a second duty ratio to a corresponding second electrode among the second electrodes. The second radio frequency power output unit is configured to control the second radio frequency power to be synchronized with the first radio frequency power or to have a phase difference from the first radio frequency power in response to the control signal.

19 Claims, 6 Drawing Sheets

U.S. PATENT DOCUMENTS

| | | | |
|---|---|---|---|
| 2006/0220574 A1* | 10/2006 | Ogawa | 315/111.21 |
| 2008/0053818 A1 | 3/2008 | Ui | |
| 2009/0255800 A1* | 10/2009 | Koshimizu | 204/164 |
| 2010/0130018 A1* | 5/2010 | Tokashiki et al. | 438/710 |
| 2011/0143537 A1* | 6/2011 | Lee et al. | 438/669 |

FOREIGN PATENT DOCUMENTS

| | | |
|---|---|---|
| JP | 2008-060429 | 3/2008 |
| KR | 10-1998-0024265 | 7/1998 |
| KR | 10-2008-0020458 | 3/2008 |

\* cited by examiner

SYNCHRONOUS PULSE PLASMA ETCHING EQUIPMENT AND METHOD OF FABRICATING A SEMICONDUCTOR DEVICE

CROSS-REFERENCE TO RELATED APPLICATION(S)

This application claims priority under 35 U.S.C. §119 to Korean Patent Application No. 10-2008-0117111, filed on Nov. 24, 2008, the contents of which are hereby incorporated herein by reference in their entirety.

BACKGROUND

1. Field

Example embodiments relate to pulse plasma etching equipment and a method of fabricating a semiconductor device, and more particularly, to synchronous pulse plasma etching equipment in which a plurality of pulse-modulated radio frequencies are synchronized with one another and applied to pulse plasma etching equipment and to a method of fabricating a semiconductor device using the synchronous pulse plasma etching equipment.

2. Description of Related Art

In conventional semiconductor processes, etching is a process for removing a lower layer along a pattern of a photoresist layer formed on a wafer. Conventional etching processes include dry and wet etching methods. Dry etching methods using plasma have been mainly used to form micro semiconductor patterns. Plasma etching is a method of removing materials through a physical or chemical reaction by injecting reactive gases into a process chamber and forming plasma. The ionized particles are then collided with a surface of a wafer.

Plasma is an energy source generated by applying radio frequency (RF) electric power. Methods of generating plasma include, for example: a capacitively coupled plasma (CCP) method and an inductively coupled plasma (ICP) method. In a CCP method, plasma is generated by applying RF electric power between parallel plates. In an ICP method, plasma is generated by applying RF electric power to a coil disposed outside a reactive tube.

Conventionally, when the RF electric power is pulse-modulated and applied, electron temperature, plasma density and plasma potential decrease when RF electric power is off (e.g., during afterglow). Thus, charging damage and radiation damage may be suppressed and/or alleviated.

SUMMARY

Example embodiments provide synchronous pulse plasma etching equipment capable of providing a plurality of operation modes while a plurality of pulse-modulated RF powers are synchronized and applied.

Example embodiments also provide the method of fabricating a semiconductor device using the synchronous pulse plasma etching equipment.

At least one example embodiment is directed to synchronous pulse plasma etching equipment. According to at least this example embodiment, the synchronous pulse plasma etching equipment includes a first electrode and one or more second electrodes configured to generate plasma in a plasma etching chamber. The synchronous pulse plasma etching equipment further includes a first radio frequency power output unit configured to apply a first radio frequency power having a first frequency and a first duty ratio to the first electrode. The first radio frequency power output unit is further configured to output a control signal including information about (indicative of) a phase of the first radio frequency power. The synchronous pulse plasma etching equipment further includes at least one second radio frequency power output unit configured to apply a second radio frequency power having a second frequency and a second duty ratio to a corresponding second electrode among the second electrodes. According to at least this example embodiment, the second radio frequency power output unit controls the second radio frequency power to be synchronized with the first radio frequency power or to have a phase difference from the first radio frequency power in response to the control signal. The first frequency, the first duty ratio, the second frequency and the second duty ratio are determined independently.

According to at least some example embodiments, the synchronous pulse plasma etching equipment further includes a mode selector. The mode selector is configured to output a first selection signal and at least one second selection signal according to a user's selection. The first radio frequency power output unit may vary the first frequency and the first duty ratio and output the first radio frequency power in response to the first selection signal. Each of the at least one second radio frequency power output units may vary the second frequency and the second duty ratio in response to a corresponding second selection signal among the at least one second selection signals. The at least one second radio frequency power output unit may also vary a phase difference between the first radio frequency power and the second radio frequency power in response to the corresponding second selection signal and the control signal.

The first RF power output unit may include: a first controller; a first radio frequency generator; a first mixer; and a first match network. The first controller is configured to output the control signal and a first pulse signal having the first frequency and the first duty ratio in response to the first selection signal. The first radio frequency generator is configured to output a first radio frequency signal having a given, desired or predetermined frequency. The first mixer is configured to mix the first radio frequency signal and the first pulse signal, and output the first radio frequency power. The first match network is configured to match a load impedance of the first electrode with a characteristic impedance of a cable connecting the first radio frequency power output unit to the first electrode, and transfer a maximum power of the first radio frequency power to the first electrode.

The second RF power output unit may include: a second controller; a second radio frequency generator; a second mixer; and a second match network. The second controller is configured to output a second pulse signal having the second frequency, the second duty ratio and a given, desired or predetermined phase difference from the first pulse signal in response to the second selection signal and the control signal. The second radio frequency generator is configured to output a second radio frequency signal having a given, desired or predetermined frequency. The second mixer is configured to mix the second radio frequency signal and the second pulse signal, and output the second radio frequency power. The second match network is configured to match a load impedance of the second electrode with a characteristic impedance of a cable connecting the second radio frequency power output unit to the second electrode, and transfer a maximum power of the second radio frequency power to the second electrode.

According to at least some example embodiments, the second controller may select a phase difference between the pulse signal and the second pulse signal from among 0°, 90°, 180°, and 270° in response to the corresponding second selection signal and the control signal, select the second frequency from among n times and 1/n times (where n is a natural number) the first frequency in response to the corresponding second selection signal, or select the second frequency from among n times and 1/n times (where n is a natural number) the first frequency in response to the corresponding second selection signal.

Each of the at least one second radio frequency power output units may select and output one from among the second radio frequency powers of a basic mode, the second radio frequency powers of a first derivative mode and the second radio frequency powers of a second derivative mode in response to the second selection signal. The second radio frequency powers of a basic mode have a second frequency, which is the same or substantially the same as the first frequency, and at least one of a phase difference and the second duty ratio different from the first radio frequency power. The second radio frequency powers of a first derivative mode have a second frequency which is n times (where n is a natural number equal to or greater than 2) the first frequency, and at least one of a phase difference and the second duty ratio different from the first radio frequency power. The second radio frequency powers of a second derivative mode have the second frequency, which is 1/n times the first frequency and the second duty ratio equal to the first duty ratio, and a phase difference different from the first radio frequency power.

At least one example embodiment is directed to a method of fabricating a semiconductor device. According to at least this example embodiment, the method of fabricating a semiconductor device includes applying a first radio frequency power having a first frequency and a first duty ratio to a first electrode in a plasma etching chamber. The semiconductor device fabricating method further includes outputting a control signal indicative of a phase of the first radio frequency power. The semiconductor device fabricating method further includes applying at least one second radio frequency power having a second frequency and a second duty ratio to at least one second electrode in the plasma etching chamber. According to at least this example embodiment, the second radio frequency power may be synchronized with the first radio frequency power or have a phase difference from the first radio frequency power in response to the control signal. The first frequency, the first duty ratio, the second frequency and the second duty ratio are determined independently.

DETAILED DESCRIPTION

Figure 1:
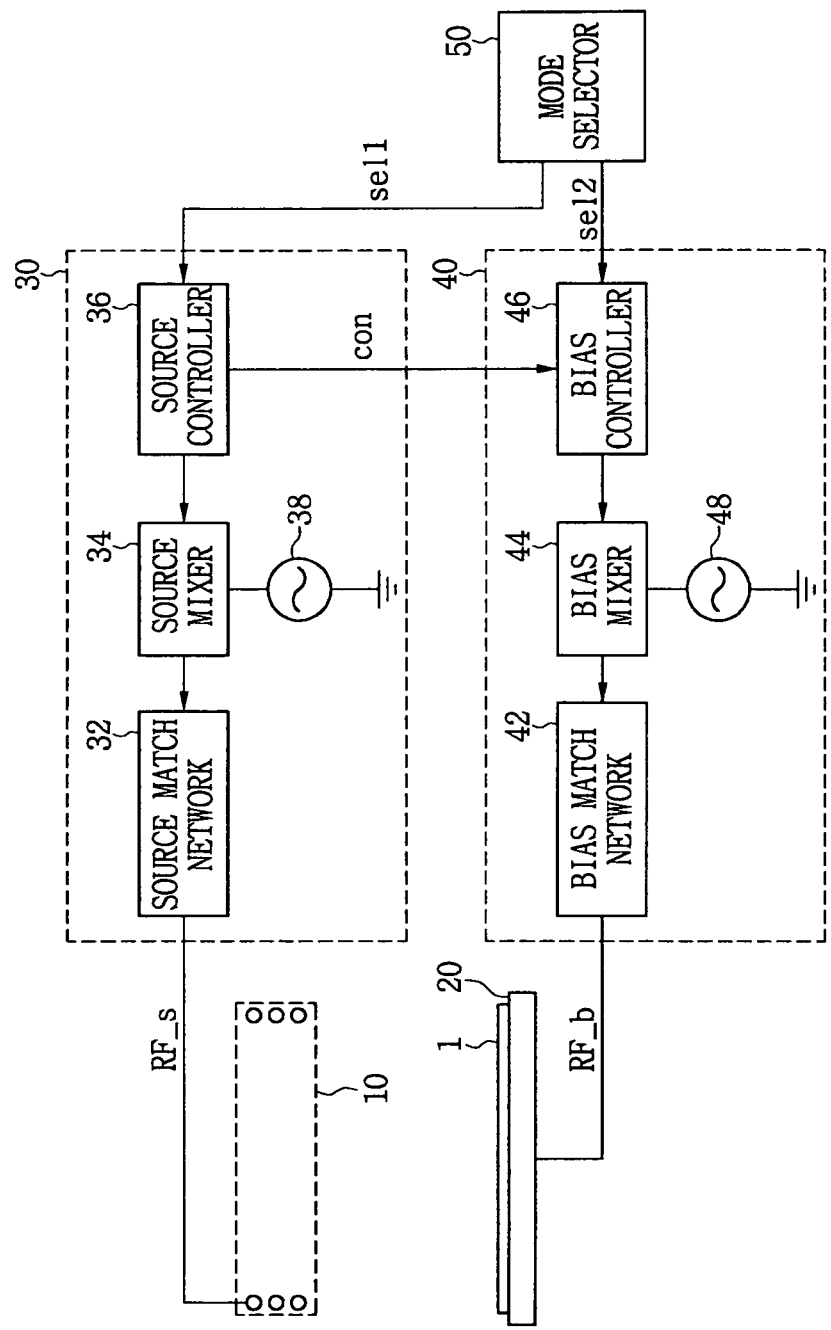
FIG. 1 illustrates synchronous pulse plasma etching equipment according to an example embodiment.

Hereinafter, synchronous pulse plasma etching equipment and a method of fabricating a semiconductor device according to example embodiments will be described below with reference to the accompanying drawings.

Example embodiments will now be described more fully with reference to the accompanying drawings, in which some example embodiments are shown. In the drawings, the thicknesses of layers and regions are exaggerated for clarity. Like reference numerals in the drawings denote like elements. In the drawings, the thicknesses of layers and regions are exaggerated for clarity.

Detailed illustrative embodiments are disclosed herein. However, specific structural and functional details disclosed herein are merely representative for purposes of describing example embodiments. Example embodiments, however, may be embodied in many alternate forms and should not be construed as limited to only the example embodiments set forth herein.

It should be understood, however, that there is no intent to limit the example embodiments to the particular example embodiments disclosed, but on the contrary example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 illustrates synchronous pulse plasma etching equipment according to an example embodiment. The synchronous pulse plasma etching equipment will be described with regard to an inductively coupled plasma (ICP) method.

As shown in FIG. 1, the synchronous pulse plasma etching equipment includes a source electrode 10 coupled to an RF source power output unit 30. The source electrode 10 is arranged above a bias electrode 20, which is coupled to an RF bias power output unit 40. A mode selector 50 is coupled to both the RF source power output unit 30 and the RF bias power output unit 40.

The RF source power output unit 30 includes a source mixer 34, which is coupled to a source match network 32, a source controller 36 and a source RF generator 38. The source match network 32 is also coupled to the source electrode 10, and the source controller 36 is coupled to the mode selector 50.

The RF bias power output unit 40 includes a bias mixer 44, which is coupled to a bias match network 42, a bias controller 46 and a bias RF generator 48. The bias match network 20 is also coupled to the bias electrode 20, and the bias controller 46 is coupled to the mode selector 50.

Reference numeral 1 in FIG. 1 represents a wafer, which may be arranged on the bias electrode 20.

Still referring to FIG. 1, the source electrode 10 and the bias electrode 20 form plasma in a plasma etching chamber (not illustrated). According to at least one example embodiment, the source electrode 10 may be shaped as a coil surrounding a ceramic wall of the plasma etching chamber (not illustrated).

In example operation, the source electrode 10 receives RF source power RF_s output from the RF source power output unit 30, and assists in generating (helps to generate) plasma in the plasma etching chamber. The bias electrode 20 receives RF bias power RF_b output from the RF bias power output unit 40, and assists in adjusting (helps to adjust) ion energy incident on a wafer 1. As noted above, the bias electrode 20 also supports the wafer 1.

The RF source power output unit 30 outputs the pulse-modulated RF source power RF_s having a given, desired or predetermined duty ratio and a given, desired or predetermined frequency to the source electrode 10 in response to a first selection signal sel1 output by the mode selector 50. The RF source power output unit 30 outputs a control signal con including information about (indicative of) a phase of the RF source power to the RF bias power output unit 40.

The RF source generator 38 may include an oscillator, etc., and is configured to output a source RF signal having a given, desired or predetermined frequency (e.g., about 100 kHz to about 100 MHz, inclusive, in an RF region, or a higher frequency in a very high frequency (VHF) or ultra high frequency (UHF) region).

The source controller 36 outputs a source pulse signal having a given, desired or predetermined duty ratio and a given, desired or predetermined frequency in response to the first selection signal sel1. The source controller 36 also outputs a control signal con including information about the source pulse signal in response to the first selection signal sel1. The control signal con may be the same or substantially the same signal as the source pulse signal.

The source mixer 34 receives the source RF signal output from the source RF generator 38 and the source pulse signal output from the source controller 36, and mixes the source RF signal and the source pulse signal to generate the pulse-modulated RF source power. The source mixer 34 outputs the pulse-modulated RF source power to the source match network 32.

The source match network 32 matches a characteristic impedance of a cable from the RF source power output unit 30 to the source electrode 10 with a load impedance of a plasma etching chamber (not illustrated). In one example, the source match network 32 matches impedances to transfer the maximum electric power of the RF source power output from the source mixer 34 to the source electrode 10.

The RF bias power output unit 40 outputs a pulse-modulated RF bias power RF_b having a given, desired or predetermined duty ratio and a given, desired or predetermined frequency in response to a second selection signal sel2 output from the mode selector 50 and the control signal con output from the RF source power output unit 30. The RF bias power output unit 40 also synchronizes a phase difference of the pulse-modulated RF bias power RF_b with the RF source power RF_s or sets the phase difference to the bias electrode 20 based on the second selection signal sel2 output from the mode selector 50 and the control signal con output from the RF source power output unit 30.

In one example, the RF bias power output unit 40 selects a frequency of the RF bias power RF_b output in response to the second selection signal sel2. The selected frequency may be between about n times and about 1/n times (where n is a natural number) a frequency of the RF source power RF_s output from the RF source power output unit 30. The RF bias power output unit 40 also selects a duty ratio of the RF bias power RF_b from among values that are the same or substantially the same as, smaller than and larger than a duty ratio of the RF source power RF_s. Also, the RF bias power output unit 40 selects a phase difference between the RF bias power RF_b and the RF source power RF_s, which are output in response to the control signal con and the second selection signal sel2. The selected phase difference may be about 0°, about 90°, about 180° or about 270°.

Still referring to FIG. 1, the bias RF generator 48 may include an oscillator, etc., and is configured to output a bias RF signal having a given, desired or predetermined frequency (e.g., about 100 kHz to about 100 MHz in an RF region, or a higher frequency in a VHF or UHF region).

The bias controller 46 outputs a bias pulse signal having a given, desired or predetermined duty ratio and a given, desired or predetermined frequency in response to the control signal con and the second selection signal sel2. The bias pulse signal also has a given, desired or predetermined phase difference from the source pulse signal.

In one example, the bias controller 46 selects a frequency of the bias pulse signal that is between about n times and about 1/n times (where n is a natural number) a frequency of the source pulse signal in response to the second selection signal sel2. The bias controller 46 also selects a duty ratio of the bias pulse signal from among values that are the same or substantially same as, smaller than and larger than a duty ratio of the source pulse signal in response to the second selection signal sel2. Also, the bias controller 46 selects a phase difference between the bias pulse signal and the source pulse signal in response to the control signal con and the second selection signal sel2. The selected phase difference may be about 0°, about 90°, about 180° or about 270°. In this example, the bias controller 46 delays a phase of the bias pulse signal by a value selected from among about 0°, about 90°, about 180° and about 270° compared to a phase of the control signal con and outputs the bias pulse signal in response to the second selection signal sel2.

Still referring to FIG. 1, the bias mixer 44 receives a bias RF signal output from the bias RF generator 48 and a bias pulse signal output from the bias controller 46. The bias mixer 44 mixes the bias RF signal and the bias pulse signal to output the pulse-modulated RF bias power.

The bias match network 42 matches a characteristic impedance of a cable from the RF bias power output unit 40 to the source electrode 10 with a load impedance of a plasma etching chamber (not illustrated). In one example, the bias match network 42 matches impedances to transfer the maximum electric power of the RF bias power output from the bias mixer 44 of the RF bias power output unit 40 to the bias electrode 20.

The mode selector 50 outputs the first selection signal sel1 to select a frequency and a duty ratio of the RF source power RF_s. The mode selector 50 outputs the second selection signal sel2 to select a frequency and a duty ratio of the RF bias power RF_b and a phase difference between the RF bias power RF_b and the RF source power RF_s according to a user's selection.

Accordingly, the example embodiment of the synchronous plasma etching equipment shown in FIG. 1 synchronizes the RF bias power RF_b applied to the bias electrode 20 to have a uniform or substantially uniform phase difference from the RF source power RF_s applied to the source electrode 10. Also, the RF bias power RF_b may have various modes, and a user may select a mode among the various modes of the RF bias power RF_b through the mode selector 50. Consequently, at least this example embodiment of the synchronous plasma etching equipment shown in FIG. 1 allows a user to select a phase difference between the RF bias power RF_b and the RF source power RF_s, a frequency of the RF bias power RF_b and a duty ratio of the RF bias power RF_b by the mode selector 50 according to demand. The frequency and the duty ratio of the RF source power RF_s, and the frequency and the duty ratio of the RF bias power RF_b may be determined independently.

FIGS. 2 through 5 illustrate example embodiments of various modes of the RF bias power RF_b, which may be provided by an example embodiment of the synchronous plasma etching equipment shown in FIG. 1. FIGS. 2 through 5 illustrate RF bias power RF_b and RF source power RF_s when the synchronous plasma etching equipment provides 12 basic modes, 12 first derivative modes and 4 second derivative modes with respect to the RF bias power RF_b. Although only 12 basic modes, 12 first derivative modes and 4 second derivative modes are discussed, example embodiments may include a greater or lesser number of modes.

In FIGS. 2 through 5, mode1 to mode12 represent first through twelfth basic modes, mode1' to mode12' represent first through twelfth first derivative modes, and mode1", mode4", mode7" and mode10" represent first to fourth second derivative modes.

According to at least this example embodiment, the basic modes mode1 to mode12 are example cases in which the frequency of the RF bias power RF_b is the same or substantially the same as the frequency of the RF source power RF_s. The first derivative modes mode1' to mode12' are example cases in which the frequency of the RF bias power RF_b is about double the frequency of the RF source power RF_s. The second derivative modes mode1", mode4", mode7" and mode10" are example cases in which the frequency of the RF bias power RF_b is about half the frequency of the RF source power RF_s.

Figure 2:
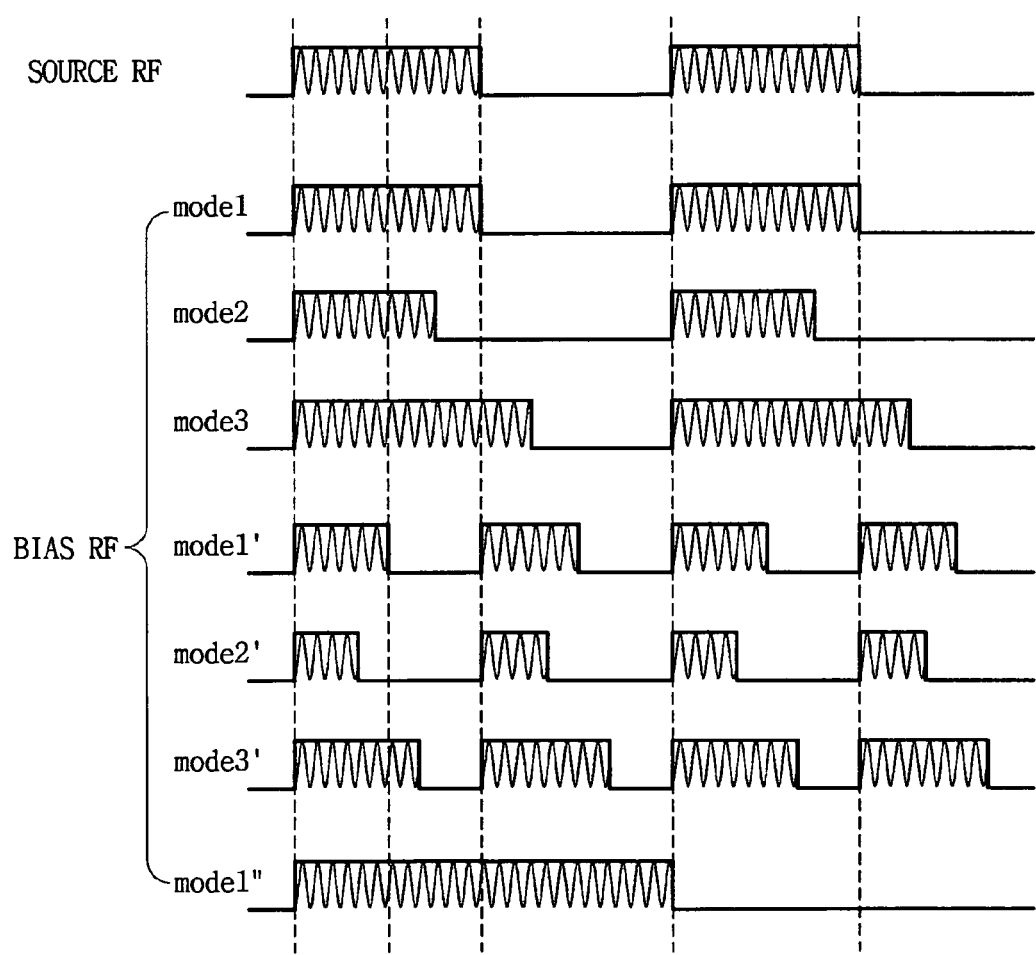
FIG. 2 illustrates a case in which a phase difference between radio-frequency (RF) source power and RF bias power is about 0°.

FIG. 2 illustrates a case in which a phase difference between the RF bias power RF_b and the RF source power RF_s is about 0°.

In the basic first mode mode1, frequencies and duty ratios of the RF bias power RF_b and the RF source power RF_s are the same or substantially the same. In the basic second mode mode2, frequencies of the RF bias power RF_b and the RF source power RF_s are the same or substantially the same, but a duty ratio of the RF bias power RF_b is smaller than a duty ratio of the RF source power RF_s. In the basic third mode mode3, frequencies of the RF bias power RF_b and the RF source power RF_s are the same or substantially the same, but a duty ratio of the RF bias power RF_b is larger than a duty ratio of the RF source power RF_s.

In the first to third of the first derivative modes mode1' to mode3', the frequency of the RF bias power RF_b is about double the frequency of the RF source power RF_s, but the duty ratios of the RF bias power RF_b is different. In the first of the first derivative modes mode1', a duty ratio of the RF bias power RF_b is the same or substantially the same as a duty ratio of the RF source power RF_s. In the second of the first derivative modes mode2', a duty ratio of the RF bias power RF_b is smaller than a duty ratio of the RF source power RF_s. In the third of the first derivative modes mode3', a duty ratio of the RF bias power RF_b is larger than a duty ratio of the RF source power RF_s.

In the first of the second derivative modes mode1", the frequency of the RF bias power RF_b is about half the frequency of the RF source power RF_s, and the duty ratio of the RF bias power RF_b is the same or substantially the same as the duty ratio of the RF source power RF_s.

Figure 3:
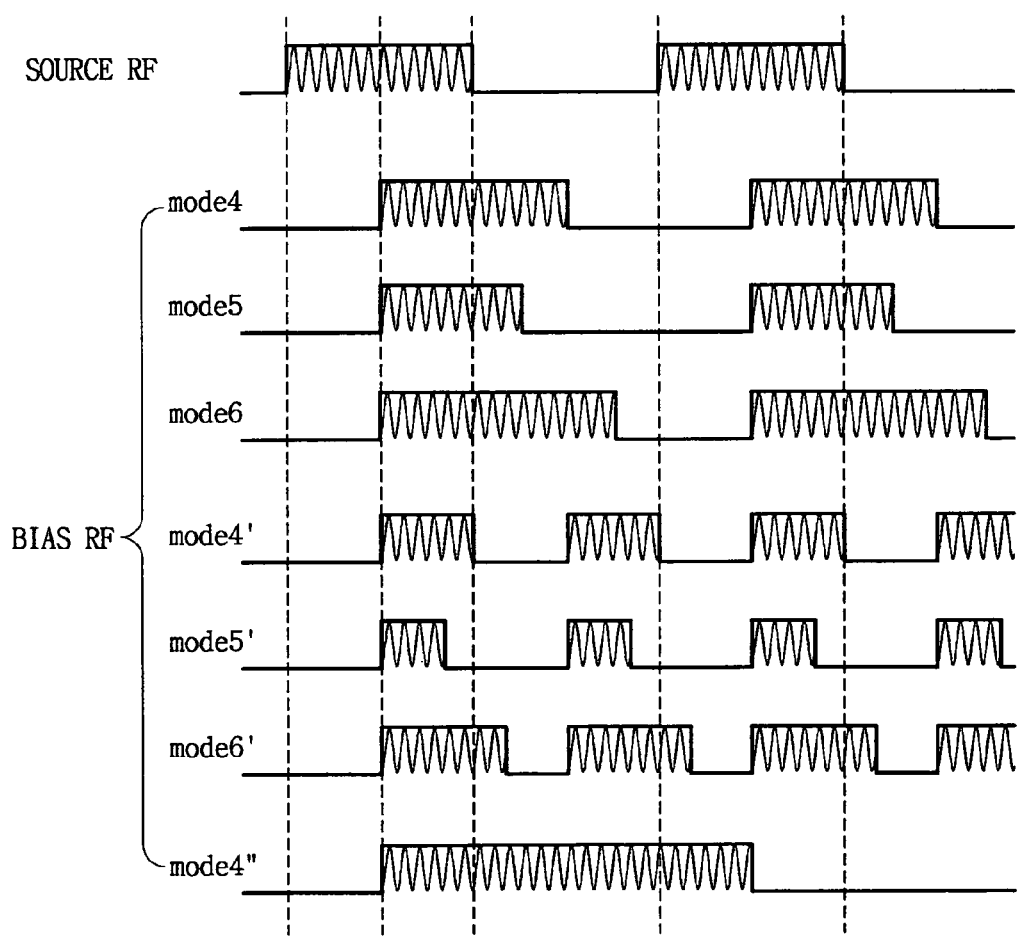
FIG. 3 illustrates a case in which a phase difference between RF source power and RF bias power is about 90°.

FIG. 3 illustrates an example case in which the phase difference between the RF bias power RF_b and the RF source power RF_s is about 90°.

Similar to FIG. 2, in the forth to sixth basic modes mode4 to mode6, the phase difference between the RF bias power RF_b and the RF source power RF_s is about 90° and the frequency of the RF bias power RF_b is the same or substantially the same as the frequency of the RF source power RF_s. But, the duty ratio of the RF bias power RF_b is different in each of the forth to sixth basic modes mode4 to mode6. In the fourth basic mode mode4, the duty ratio of the RF bias power RF_b is the same or substantially the same as the duty ratio of the RF source power RF_s. In the fifth basic mode mode5, the duty ratio of the RF bias power RF_b is smaller than the duty ratio of the RF source power RF_s. In the sixth basic mode mode6, the duty ratio of the RF bias power RF_b is larger than the duty ratio of the RF source power RF_s.

Still referring to FIG. 3, in each of the fourth to sixth of the first derivative modes mode4' to mode6', the phase difference between the RF bias power RF_b and the RF source power RF_s is about 90°, and the frequency of the RF bias power RF_b is about double the frequency of the RF source power RF_s. But, in each of the fourth to sixth of the first derivative modes mode4' to mode6' the duty ratio of the RF bias power RF_b is different. In the fourth of the first derivative modes mode4', the duty ratio of the RF bias power RF_b is the same or substantially the same as the duty ratio of the RF source power RF_s. In the fifth of the first derivative modes mode5', the duty ratio of the RF bias power RF_b is smaller than the duty ratio of the RF source power RF_s. In the sixth of the first derivative modes mode6', the duty ratio of the RF bias power RF_b is larger than the duty ratio of the RF source power RF_s.

In the second of the second derivative modes mode4" shown in FIG. 3, the phase difference between the RF bias power RF_b and the RF source power RF_s is about 90°, the frequency of the RF bias power RF_b is about half the frequency of the RF source power RF_s, and the duty ratio of the RF bias power RF_b is the same or substantially the same as the duty ratio of the RF source power RF_s.

Figure 4:
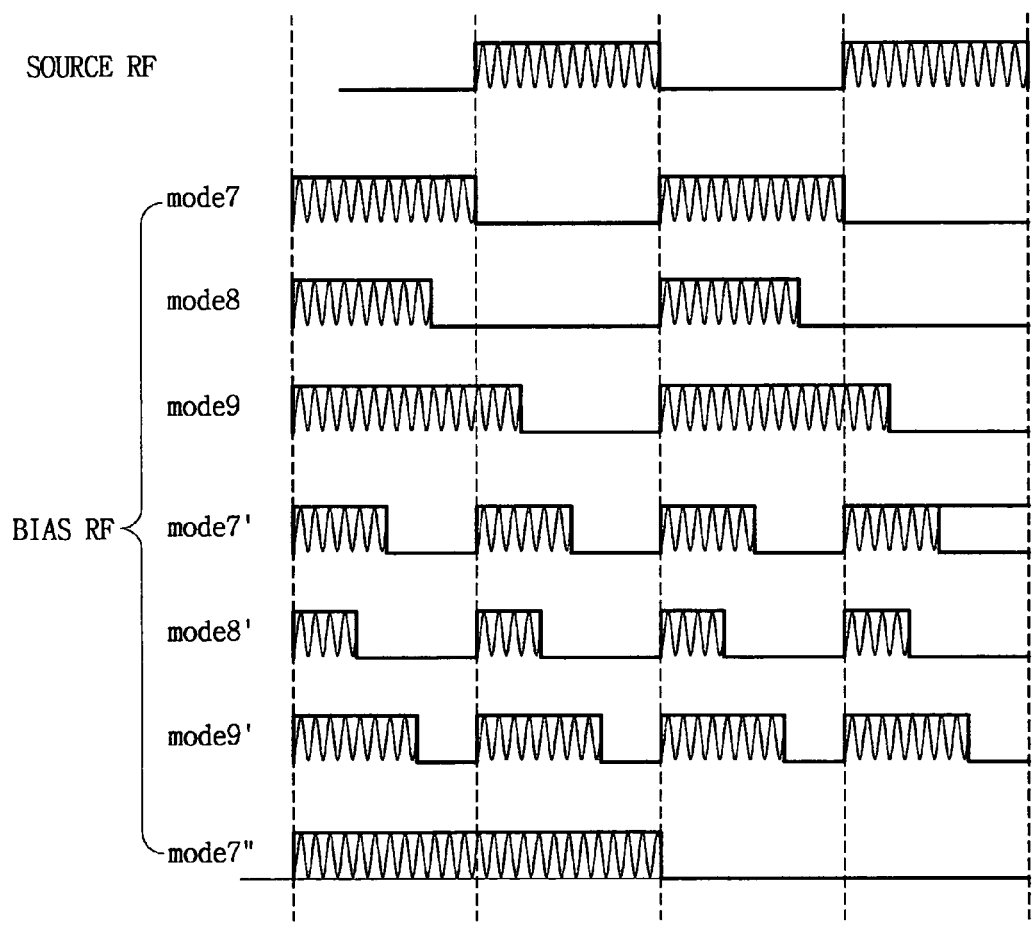
FIG. 4 illustrates a case in which a phase difference between RF source power and RF bias power is about 180°.

FIG. 4 illustrates an example case in which the phase difference between the RF bias power RF_b and the RF source power RF_s is about 180°.

In the seventh to ninth basic modes mode7 to mode9, the phase difference between the RF bias power RF_b and the RF source power RF_s is about 180°, and the frequency of the RF bias power RF_b is the same or substantially the same as the frequency of the RF source power RF_s. But, in the seventh to ninth basic modes mode7 to mode9 the duty ratio of the RF bias power RF_b is different. In the seventh basic mode mode7, the duty ratio of the RF bias power RF_b is the same or substantially the same as the duty ratio of the RF source power RF_s. In the eighth basic mode mode8, the duty ratio of the RF bias power RF_b is smaller than the duty ratio of the RF source power RF_s. In the ninth basic mode mode9, the duty ratio of the RF bias power RF_b is larger than the duty ratio of the RF source power RF_s.

Also, in the seventh to ninth of the first derivative modes mode7' to mode9' shown in FIG. 4, the phase difference between the RF bias power RF_b and the RF source power RF_s is about 180°, and the frequency of the RF bias power RF_b is about double the frequency of the RF source power RF_s. But, in the seventh to ninth of the first derivative modes mode7' to mode9' the duty ratio of the RF bias power RF_b is different. In the seventh of the first derivative modes mode7', the duty ratio of the RF bias power RF_b is the same or substantially the same as the duty ratio of the RF source power RF_s. In the eighth of the first derivative modes mode8', the duty ratio of the RF bias power RF_b is smaller than the duty ratio of the RF source power RF_s. In the ninth of the first derivative modes mode9', the duty ratio of the RF bias power RF_b is larger than the duty ratio of the RF source power RF_s.

In the third of the second derivative modes mode1" shown in FIG. 4, the phase difference between the RF bias power RF_b and the RF source power RF_s is about 180°, the frequency of the RF bias power RF_b is about half the frequency of the RF source power RF_s, and the duty ratio of the RF bias power RF_b is the same or substantially the same as the duty ratio of the RF source power RF_s.

Figure 5:
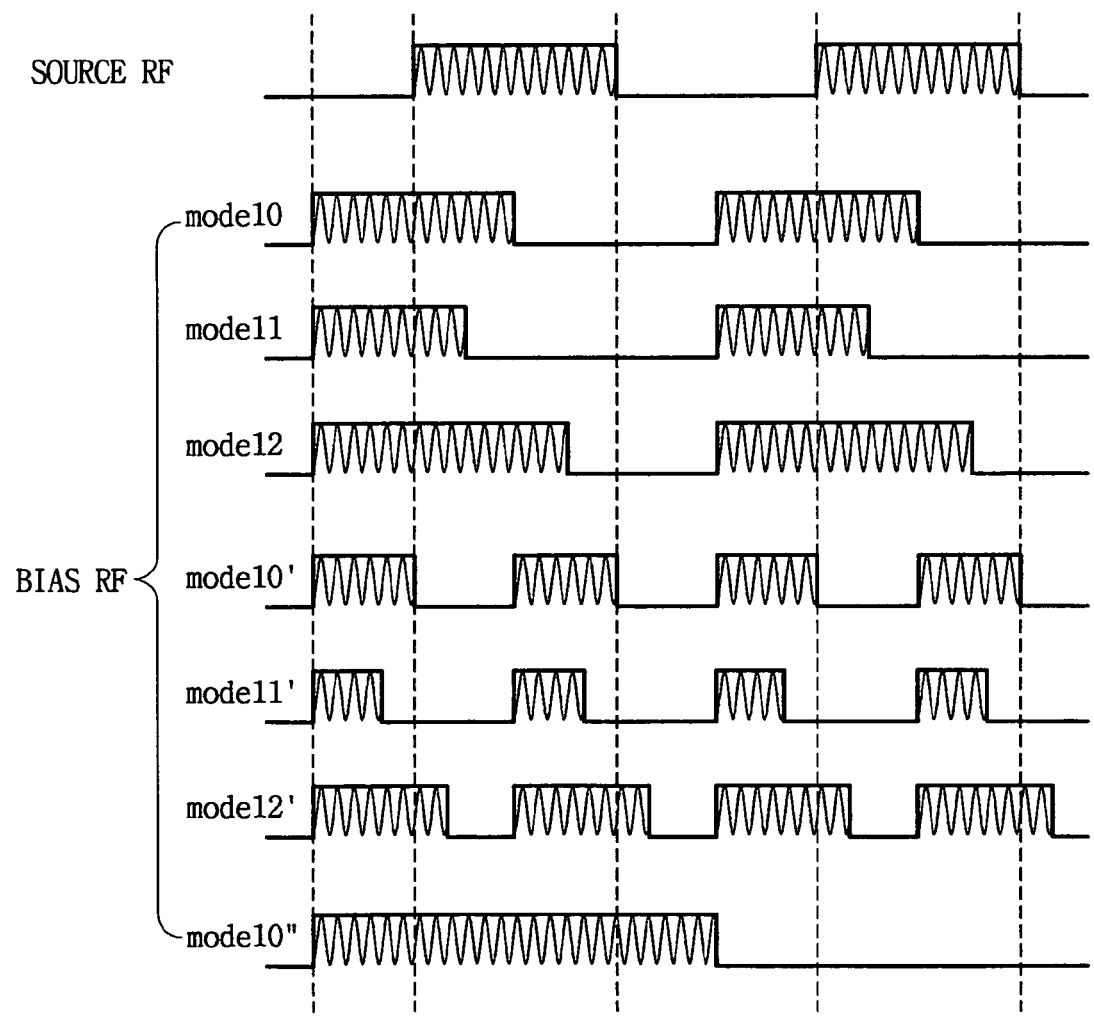
FIG. 5 illustrates a case in which a phase difference between RF source power and RF bias power is about 270°.

FIG. 5 illustrates an example case in which the phase difference between the RF bias power RF_b and the RF source power RF_s is about 270°.

In the tenth to twelfth basic modes mode10 to mode12, the phase difference between the RF bias power RF_b and the RF source power RF_s is about 270°, and the frequency of the RF bias power RF_b is the same or substantially the same as the frequency of the RF source power RF_s. But, in the tenth to twelfth basic modes mode10 to mode12 the duty ratio of the RF bias power RF_b is different. In the tenth basic mode mode10, the duty ratio of the RF bias power RF_b is the same or substantially the same as the duty ratio of the RF source power RF_s. In the eleventh basic mode mode11, the duty ratio of the RF bias power RF_b is smaller than the duty ratio of the RF source power RF_s. In the twelfth basic mode mode12, the duty ratio of the RF bias power RF_b is larger than the duty ratio of the RF source power RF_s.

In the tenth to twelfth of the first derivative modes mode10' to mode12' shown in FIG. 5, the phase difference between the RF bias power RF_b and the RF source power RF_s is about 270° and the frequency of the RF bias power RF_b is about double the frequency of the RF source power RF_s. But, in the tenth to twelfth of the first derivative modes mode10' to mode12' the duty ratio of the RF bias power RF_b is different. In the tenth of the first derivative modes mode10, the duty ratio of the RF bias power RF_b is the same or substantially the same as the duty ratio of the RF source power RF_s. In the eleventh of the first derivative modes mode11', the duty ratio of the RF bias power RF_b is smaller than the duty ratio of the RF source power RF_s. In the twelfth of the first derivative modes mode12', the duty ratio of the RF bias power RF_b is larger than the duty ratio of the RF source power RF_s.

Also, in the fourth of the second derivative modes mode10" shown in FIG. 5, the phase difference between the RF bias power RF_b and the RF source power RF_s is about 270°, the frequency of the RF bias power RF_b is about half the frequency of the RF source power RF_s, and the duty ratio of the RF bias power RF_b is the same or substantially the same as the duty ratio of the RF source power RF_s.

The synchronous pulse plasma etching equipment shown in FIG. 1 may provide RF bias powers RF_b of twelve basic modes mode1 to mode12, twelve first derivative modes mode1' to mode12' and four second derivative modes mode1", mode4", mode7" and mode10". Accordingly, when synchronous pulse plasma etching equipment according to at least some example embodiments is used, a user may select an appropriate RF bias power RF_b according to demand. For example, a user may select one among the basic first mode to the basic third mode to form a gate of a transistor or to decrease an RF reflective wave. A user may also select one of the first derivative modes to increase an etch rate.

Figure 6:
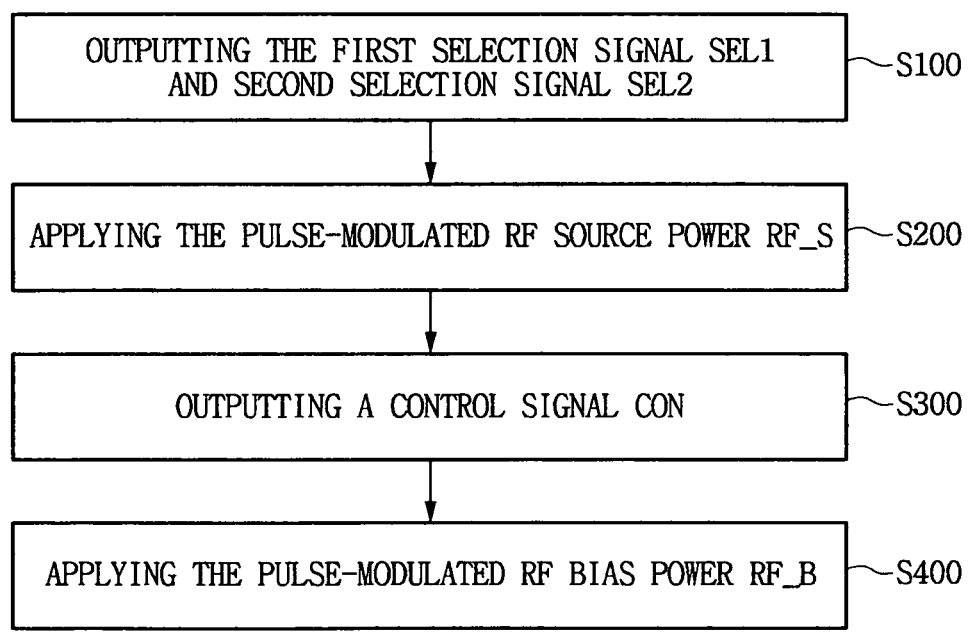
FIG. 6 illustrates a method of fabricating a semiconductor device according to an example embodiment.

FIG. 6 illustrates the method of fabricating a semiconductor device according to an example embodiment.

In step s100, the first selection signal sel1 and the second selection signal sel1 is output.

In step s200, the pulse-modulated RF source power RF_s having the first frequency and the first duty ratio is applied to the source electrode 10 in the plasma etching chamber. The first frequency and the first duty ratio may be varied in response to the first selection signal sel1.

The applying of the pulse-modulated RF source power RF_s (step s200) may include outputting the control signal con and a source pulse signal having the first frequency and the first duty ratio in response to a first selection signal sel1, outputting the source RF signal having a given, desired or predetermined frequency (e.g., about 100 kHz to about 100 MHz, inclusive, in an RF region, or a higher frequency in a very high frequency (VHF) or ultra high frequency (UHF) region), mixing the source RF signal and the source pulse signal to output the pulse-modulated RF source power RF_s, and matching a load impedance of the source electrode 10 with a characteristic impedance of a cable transmitting the pulse-modulated RF source power RF_s to the source electrode 10 to transfer a maximum power of the pulse-modulated RF source power RF_s to the source electrode 10.

In step s300, the control signal con indicative of a phase of the first radio frequency power is output.

In step s400, the pulse-modulated RF bias power RF_b having a second frequency and a second duty ratio to the bias electrode 20 in the plasma etching chamber. The pulse-modulated RF bias power RF_b may be synchronized with the pulse-modulated RF source power RF_s or have a phase difference from the pulse-modulated RF source power RF_s in response to the control signal con. That is, the phase difference between the pulse-modulated RF source power RF_s and the pulse-modulated RF bias power RF_b may be varied in response to the second selection signal sel2 and the control signal con, and the second frequency and the second duty ratio may be varied in response to the second selection signal sel2. The phase difference between the pulse-modulated RF source power RF_s and the pulse-modulated RF bias power RF_b may be selected from among about 0°, about 90°, about 180°, and about 270° in response to the second selection signal sel2 and the control signal con.

The first frequency and the first duty ratio of the pulse-modulated RF source power RF_s may be varied in response to the first selection signal sel1, and the second frequency and the second duty ratio of the pulse-modulated RF bias power RF_b may be varied in response to the second signal sel2. That is, the first frequency, the first duty ratio, the second frequency, and the second duty ratio are determined independently. The second frequency may be selected from among n times and 1/n times (where n is a natural number) the first frequency in response to the second selection signal sel2. The second duty ratio may be selected from among values which are the same as, smaller than, and larger than the first duty ratio in response to the second selection signal sel2.

The applying of the pulse-modulated RF bias power RF_b may include outputting the bias pulse signal having the second frequency, the second duty ratio and the phase difference from the source pulse signal in response to the second selection signal sel2 and the control signal con, outputting the bias RF signal having a given, desired or predetermined frequency (e.g., about 100 kHz to about 100 MHz in an RF region, or a higher frequency in a VHF or UHF region), mixing the bias RF signal and the bias pulse signal to output the pulse-modulated RF bias power RF_b, and matching a load impedance of the bias electrode 20 with a characteristic impedance of a cable transmitting the pulse-modulated RF bias power RF_b to the bias electrode 20 to transfer a maximum power of the pulse-modulated RF bias power RF_b to the bias electrode 20.

According to at least some example embodiments, a user may select one of the various modes provided by the synchronous pulse plasma etching equipment and etch silicon materials (e.g., single crystal Si, poly crystal Si, high-melting metal silicide, etc.), various silicon oxide materials, various silicon nitride materials, low permittivity materials (e.g., hydrogen silsesquioxane (HSQ), methyl silsesquioxane (MSQ), porous silica, etc.), various organic layer materials (chemical vapor deposition (CVD) type, Spin-on type, etc.), various metallic materials (e.g., semiconductor materials such as W, WN, Ti, TiN, Ta, TaN, Mo, Al, etc.) and high permittivity materials disposed on the wafer.

Although example embodiments described above are described with respect to the plasma etching equipment of an ICP method, the concepts may be applicable to plasma etching equipments of other methods such as a capacitively coupled plasma (CCP) method.

Also, in the example embodiments described above, although a case of two RF powers (e.g., RF source power and RF bias power) is described, the concepts may be applicable to cases in which a plurality of RF powers are applied by regarding one of the plurality of RF powers as a reference phase. In this case, the plasma etching equipment may include a plurality of electrodes, which receive corresponding RF power among the plurality of RF powers and generate plasma.

Also, in the example embodiments described above, although it is described that the synchronous pulse plasma etching equipment provides twelve basic modes, twelve first derivative modes and four second derivative modes, the number of modes may be reduced or increased as needed.

Therefore, synchronous pulse plasma etching equipment and a method of fabricating a semiconductor device according to example embodiments may receive a plurality of synchronized pulse-modulated RF electric powers, and allow a user to more efficiently use the pulse plasma etching equipment as needed by providing various operation modes.

Although example embodiments have been briefly described with reference to the example embodiments, those skilled in the art will readily appreciate that many modifications can be made to the example embodiments without departing from the novel teachings and scope of the example embodiments described herein.

What is claimed is:

1. Synchronous pulse plasma etching equipment, comprising:
a first electrode and at least one second electrode configured to generate plasma in a plasma etching chamber;
a first radio frequency power output unit configured to apply a first radio frequency power having a first frequency and a first duty ratio to the first electrode, and to output a control signal indicative of a phase of the first radio frequency power; and
at least one second radio frequency power output unit configured to apply a second radio frequency power having a second frequency and a second duty ratio to the at least one second electrode; wherein
the at least one second radio frequency power output unit controls the second radio frequency power to be synchronized with the first radio frequency power or to have a phase difference from the first radio frequency power in response to the control signal, and the first frequency, the first duty ratio, the second frequency and the second duty ratio are determined independently.

2. The synchronous pulse plasma etching equipment according to claim 1, further comprising:
a mode selector configured to output a first selection signal and at least one second selection signal according to a user's selection; wherein
the first radio frequency power output unit is further configured to vary the first frequency and the first duty ratio, and to output the first radio frequency power in response to the first selection signal, and
the at least one second radio frequency power output unit is further configured to vary the second frequency and the second duty ratio in response to the at least one second selection signal and vary a phase difference between the first radio frequency power and the second radio frequency power in response to the at least one second selection signal and the control signal.

3. The synchronous pulse plasma etching equipment according to claim 2, wherein the first radio frequency power output unit comprises:
a first controller configured to output the control signal and a first pulse signal having the first frequency and the first duty ratio in response to the first selection signal;
a first radio frequency generator configured to output a first radio frequency signal having a third frequency;
a first mixer configured to mix the first radio frequency signal and the first pulse signal, and to output the first radio frequency power; and
a first match network configured to match a load impedance of the first electrode with a characteristic impedance of a cable connecting the first radio frequency power output unit to the first electrode, and to transfer a maximum power of the first radio frequency power to the first electrode.

4. The synchronous pulse plasma etching equipment according to claim 3, wherein the at least one second radio frequency power output unit comprises:
a second controller configured to output a second pulse signal having the second frequency, the second duty ratio and a first phase difference from the first pulse signal in response to the at least one second selection signal and the control signal;
a second radio frequency generator configured to output a second radio frequency signal having the third frequency;
a second mixer configured to mix the second radio frequency signal and the second pulse signal, and to output the second radio frequency power; and
a second match network configured to match a load impedance of the at least one second electrode with a characteristic impedance of a cable connecting the at least one second radio frequency power output unit to the at least one second electrode, and to transfer a maximum power of the second radio frequency power to the at least one second electrode.

5. The synchronous pulse plasma etching equipment according to claim 4, wherein the second controller is configured to select a phase difference between the first pulse signal and the second pulse signal from among about 0°, about 90°, about 180°, and about 270° in response to the at least one second selection signal and the control signal.

6. The synchronous pulse plasma etching equipment according to claim 4, wherein the second controller is configured to select the second frequency from among n times and 1/n times (where n is a natural number) the first frequency in response to the at least one second selection signal.

7. The synchronous pulse plasma etching equipment according to claim 4, wherein the second controller is configured to select the second duty ratio from among values which are the same as, smaller than, and larger than the first duty ratio in response to the at least one second selection signal.

8. The synchronous pulse plasma etching equipment according to claim 2, wherein the at least one second radio frequency power output unit is configured to select and output one from among the second radio frequency powers of a basic mode, the second radio frequency powers of a first derivative mode, and the second radio frequency powers of a second derivative mode in response to the at least one second selection signal, wherein
the second radio frequency powers of a basic mode have a second frequency, which is the same as the first frequency, and at least one of a phase difference and a second duty ratio different from the first radio frequency power,
the second radio frequency powers of a first derivative mode have a second frequency which is n times (n is a natural number equal to or greater than 2) the first frequency, and at least one of a phase difference and a second duty ratio different from the first radio frequency power; and
the second radio frequency powers of a second derivative mode have a second frequency, which is 1/n times the first frequency, a second duty ratio equal to the first duty ratio, and a phase difference different from the first radio frequency power.

9. The synchronous pulse plasma etching equipment according to claim 1, wherein the first radio frequency power output unit comprises:
a controller configured to output the control signal and a first pulse signal having the first frequency and the first duty ratio in response to a selection signal;
a radio frequency generator configured to output a first radio frequency signal having a third frequency;
a mixer configured to mix the first radio frequency signal and the first pulse signal, and to output the first radio frequency power; and
a match network configured to match a load impedance of the first electrode with a characteristic impedance of a cable connecting the first radio frequency power output unit to the first electrode, and to transfer a maximum power of the first radio frequency power to the first electrode.

10. The synchronous pulse plasma etching equipment according to claim 1, wherein the at least one second radio frequency power output unit comprises:
a controller configured to output a pulse signal having the second frequency, the second duty ratio and a phase difference from the first pulse signal in response to the at least one second selection signal and the control signal;
a radio frequency generator configured to output a radio frequency signal having a third frequency;
a mixer configured to mix the radio frequency signal and the pulse signal, and to output the second radio frequency power; and
a second match network configured to match a load impedance of the at least one second electrode with a characteristic impedance of a cable connecting the at least one second radio frequency power output unit to the at least one second electrode, and to transfer a maximum power of the second radio frequency power to the at least one second electrode.

11. A method of fabricating a semiconductor device, comprising:
applying a first radio frequency power having a first frequency and a first duty ratio to a first electrode in a plasma etching chamber;
outputting a control signal indicative of a phase of the first radio frequency power; and
applying at least one second radio frequency power having a second frequency and a second duty ratio to at least one second electrode in the plasma etching chamber; wherein
the second radio frequency power is synchronized with the first radio frequency power or has a phase difference from the first radio frequency power in response to the control signal, and
the first frequency, the first duty ratio, the second frequency and the second duty ratio are determined independently.

12. The method according to claim 11, further comprising:
outputting a first selection signal and at least one second selection signal according to a user's selection; wherein applying the first radio frequency power includes:
varying the first frequency and the first duty ratio of the first radio frequency power in response to the first selection signal.

13. The method according to claim 12, wherein applying the second radio frequency power comprises:
varying the second frequency and the second duty ratio of the second radio frequency power in response to the at least one second selection signal; and
varying the phase difference between the first radio frequency power and the second radio frequency power in response to the at least one second selection signal and the control signal.

14. The method according to claim 11, wherein applying the first radio frequency power comprises:
outputting the control signal and a first pulse signal having the first frequency and the first duty ratio in response to a first selection signal;
outputting a first radio frequency signal having a third frequency; mixing the first radio frequency signal and the first pulse signal to output the first radio frequency power; and
matching a load impedance of the first electrode with a characteristic impedance of a cable transmitting the first radio frequency power to the first electrode to transfer a maximum power of the first radio frequency power to the first electrode.

15. The method according to claim 11, wherein applying the at least one second radio frequency power comprises:
outputting a second pulse signal having the second frequency, the second duty ratio and the phase difference from the first pulse signal in response to at least one second selection signal and the control signal;

outputting a second radio frequency signal having the third frequency; mixing the second radio frequency signal and the second pulse signal to output the second radio frequency power; and matching a load impedance of the at least one second electrode with a characteristic impedance of a cable transmitting the at least one second radio frequency power to the at least one second electrode to transfer a maximum power of the second radio frequency power to the at least one second electrode.

16. The method according to claim 11, wherein the phase difference between the first pulse signal and the second pulse signal is selected from among about 0°, about 90°, about 180°, and about 270° in response to the at least one second selection signal and the control signal.

17. The method according to claim 11, wherein the second frequency is selected from among n times and 1/n times (where n is a natural number) the first frequency in response to the at least one second selection signal.

18. The method according to claim 11, wherein the second duty ratio is selected from among values which are the same as, smaller than, and larger than the first duty ratio in response to the at least one second selection signal.

19. The method according to claim 11, wherein the second radio frequency powers have a basic mode, the second radio frequency powers of a first derivative mode, and the second radio frequency powers of a second derivative mode, wherein the second radio frequency powers of a basic mode have a second frequency, which is the same as the first frequency, and at least one of a phase difference and a second duty ratio different from the first radio frequency power, the second radio frequency powers of a first derivative mode have a second frequency which is n times (n is a natural number equal to or greater than 2) the first frequency, and at least one of a phase difference and a second duty ratio different from the first radio frequency power; and the second radio frequency powers of a second derivative mode have a second frequency, which is 1/n times the first frequency, a second duty ratio equal to the first duty ratio, and a phase difference different from the first radio frequency power.

* * * * *